(12) United States Patent
Jeon et al.

(10) Patent No.: US 9,490,263 B2
(45) Date of Patent: Nov. 8, 2016

(54) SEMICONDUCTOR DEVICE AND METHOD OF FORMING THE SAME

(71) Applicant: Samsung Electronics Co., Ltd., Suwon-si (KR)

(72) Inventors: Sooyeon Jeon, Suwon-si (KR); Rwik Sengupta, Hwaseong-si (KR); Chulhong Park, Seongnam-Si (KR); Kwanyoung Chun, Suwon-si (KR); Yusun Lee, Seoul (KR); Hyun-Jong Lee, Hwaseong-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/312,702

(22) Filed: Jun. 24, 2014

(65) Prior Publication Data

US 2015/0084097 A1 Mar. 26, 2015

(30) Foreign Application Priority Data

Sep. 24, 2013 (KR) .................... 10-2013-0113410

(51) Int. Cl.
 *H01L 27/118* (2006.01)
 *H01L 27/02* (2006.01)
(52) U.S. Cl.
 CPC ..... *H01L 27/11807* (2013.01); *H01L 27/0207* (2013.01); *H01L 2027/11861* (2013.01); *H01L 2027/11881* (2013.01)
(58) Field of Classification Search
 CPC ............... H01L 27/11807; H01L 2027/11881; H01L 27/0207

USPC .......................................... 257/206; 438/129
See application file for complete search history.

(56) References Cited

U.S. PATENT DOCUMENTS

| | | | |
|---|---|---|---|
| 6,271,570 B1 | 8/2001 | Huang et al. | |
| 6,351,016 B1 | 2/2002 | Huang et al. | |
| 8,183,600 B2 | 5/2012 | Shimizu | |
| 8,357,955 B2 | 1/2013 | Tanaka | |
| 2005/0280031 A1* | 12/2005 | Yano | H01L 27/0207 257/202 |
| 2006/0186478 A1* | 8/2006 | Hughes | H01L 27/11807 257/368 |
| 2008/0169487 A1 | 7/2008 | Shimbo et al. | |
| 2013/0026572 A1 | 1/2013 | Kawa et al. | |

FOREIGN PATENT DOCUMENTS

| | | |
|---|---|---|
| JP | 10-125787 | 5/1998 |
| JP | 10-173055 | 6/1998 |
| JP | 2010-087336 | 4/2010 |
| KR | 10-1998-0020089 | 6/1998 |

* cited by examiner

*Primary Examiner* — Elias M Ullah
(74) *Attorney, Agent, or Firm* — Muir Patent Law, PLLC

(57) ABSTRACT

A semiconductor device includes a substrate on which a plurality of logic cells are provided, and a plurality of active portions provided on the substrate and extending in a first direction. Contacts and gate structures extend in a second direction intersecting the first direction and are alternately arranged. A common conductive line extends along a boundary region of the plurality of logic cells in the first direction. At least one of the contacts is electrically connected to the common conductive line through a via therebetween, and each of the contacts intersects a plurality of the active portions. End portions of the contacts are aligned with each other along the first direction.

12 Claims, 14 Drawing Sheets

SEMICONDUCTOR DEVICE AND METHOD OF FORMING THE SAME

CROSS-REFERENCE TO RELATED APPLICATION

This U.S. non-provisional patent application claims priority under 35 U.S.C. §119 to Korean Patent Application No. 10-2013-0113410, filed on Sep. 24, 2013, in the Korean Intellectual Property Office, the disclosure of which is hereby incorporated by reference in its entirety.

BACKGROUND

This disclosure relates to a semiconductor device and method of forming the same, and more particularly, to a semiconductor device including a plurality of logic cells and a method of forming the same.

Semiconductor devices are very attractive in an electronic industry because of their small size, multi-function, and/or low manufacturing costs. Semiconductor devices may be categorized as any one of semiconductor memory devices storing data, semiconductor logic devices processing operations of logical data, and hybrid semiconductor devices having both functions of the semiconductor memory devices and the functions of the semiconductor logic devices. Excellent characteristics of semiconductor devices have been demanded with the development of the electronic industry. For example, high reliable, high speed and/or multi-functional semiconductor devices have been increasingly demanded. In order to satisfy the demands, structures of the semiconductor devices have been complex and the semiconductor devices have been highly integrated. It is desirable to continue the trend of increasingly smaller semiconductor devices.

SUMMARY

Embodiments disclosed herein may provide a semiconductor device including bar type contacts connecting a plurality of active portions and a method of forming the same.

Embodiments may also provide a semiconductor device capable of improving the degree of freedom of disposition of vias by using bar type contacts and a method of forming the same.

Embodiments may further provide a semiconductor device a highly integrated semiconductor device and a method of forming the same.

In one aspect, a semiconductor device includes: a substrate on which a plurality of logic cells are provided; a plurality of active portions provided on the substrate and extending in a first direction; contacts and gate structures extending in a second direction intersecting the first direction, the contacts and the gate structures alternately arranged; and a common conductive line extending along a boundary region of the plurality of logic cells in the first direction. At least one of the contacts is electrically connected to the common conductive line through a via therebetween. Each of the contacts intersects a plurality of the active portions, and end portions of the contacts are aligned with each other along the first direction.

In some embodiments, each of the contacts is in contact with the plurality of active portions.

In some embodiments, each of the plurality of active portions includes source/drain regions, and each of the contacts is connected in common to a plurality of source/drain regions adjacent to each other in the second direction.

In some embodiments, each of the logic cells includes a P-type metal-oxide-semiconductor field effect transistor (PMOSFET) region and an N-type metal-oxide-semiconductor field effect transistor (NMOSFET) region. The contacts may include PMOS contacts on the PMOSFET region and NMOS contacts on the NMOSFET region, and the PMOS contacts and the NMOS contacts may be separated from each other at a boundary region of the PMOSFET region and the NMOSFET region.

In some embodiments, each PMOS contact is aligned with a respective NMOS contact in the second direction.

In some embodiments, the semiconductor device further includes a first separating insulation layer extending in the first direction on the boundary region of the PMOSFET region and the NMOSFET region. The first separating insulation layer may separate the PMOS contacts from the NMOS contacts.

In some embodiments, the first separating insulation layer has a straight line-shape.

In some embodiments, the semiconductor device further includes: a first device isolation layer provided in the substrate between the PMOSFET region and the NMOSFET region.

In some embodiments, end portions of the PMOS contacts are aligned with each other in the first direction on the first device isolation layer.

In some embodiments, end portions of the NMOS contacts are aligned with each other in the first direction on the first device isolation layer.

In some embodiments, the gate structures extend from the PMOSFET region onto the NMOSFET region.

In some embodiments, the plurality of logic cells include: a first logic cell; and a second logic cell spaced apart from the first logic cell. The common conductive line may be disposed between the first logic cell and the second logic cell. In this case, the semiconductor device may further include: a second device isolation layer provided in the substrate between the first logic cell and the second logic cell. The second device isolation layer extends along the common conductive line in the first direction.

In some embodiments, the semiconductor device further includes: a second separating insulation layer separating the contacts of the first logic cell from the contacts of the second logic cell. The second separating insulation layer may extend in the first direction under the common conductive line, and the contacts of the first logic cells may be aligned with the contacts of the second logic cell in the second direction.

In some embodiments, the second separating insulation layer may have a straight line-shape.

In some embodiments, odd-numbered contacts of the contacts may be electrically connected to the common conductive line through vias therebetween, and even-numbered contacts of the contacts may be spaced apart from the common conductive line by an interlayer insulating layer therebetween.

In some embodiments, lengths of the contacts may be substantially equal to each other.

In some embodiments, a semiconductor device includes: a substrate on which a plurality of logic cells are provided, each logic cell including a P-type metal-oxide-semiconductor field effect transistor (PMOSFET) region and an N-type metal-oxide-semiconductor field effect transistor (NMOSFET) region; a plurality of active portions provided on the substrate and extending in a first direction; contacts and gate structures extending in a second direction intersecting the first direction, the contacts and the gate structures alternately arranged; and a common conductive line extending along a boundary region of the plurality of logic cells in the first direction. At least one of the contacts is electrically connected to the common conductive line through a via therebetween, and each of the contacts has a bar shape extending in the second direction and covers a plurality of the active portions.

In one embodiment, end portions of the contacts are aligned with each other along the first direction.

In one embodiment, a first set of the contacts electrically connects to the common conductive line through a first set of vias, and a second set of the contacts electrically connects to a conductive line different from the common conductive line through a second set of vias.

In another aspect, a method of forming a semiconductor device includes: preparing a substrate including a plurality of logic cell regions, each of the logic cells including a P-type metal-oxide-semiconductor field effect transistor (PMOSFET) region and an N-type metal-oxide-semiconductor field effect transistor (NMOSFET) region; forming a plurality of active portions extending in a first direction on the substrate; forming gate structures extending in a second direction intersecting the plurality of active portions; forming line-type conductive patterns connected in common to the plurality of active portions, the line-type conductive patterns extending in the second direction; and patterning the line-type conductive patterns to form bar-type contacts separated from each other between the plurality of logic cell regions and between the NMOSFET region and the PMOSFET region.

In some embodiments, patterning the line-type conductive patterns to form the bar-type contacts includes: forming a first trench extending in the first direction to cut the line-type conductive patterns between the NMOSFET region and the PMOSFET region; and forming a second trench extending in the first direction to cut line-type conductive patterns between the plurality of logic cell regions.

In some embodiments, the first trench and the second trench are formed at the same time.

In some embodiments, the method further includes: forming vias on the bar-type contacts; and forming a common conductive line on the vias. The bar-type contacts may be connected to the common conductive line through the vias.

BRIEF DESCRIPTION OF THE DRAWINGS

The disclosed embodiments will become more apparent in view of the attached drawings and accompanying detailed description.

FIGS. 7A to 11A are cross-sectional views taken along a line I-I' of FIG. 2 to illustrate an exemplary method of forming a semiconductor device according to some embodiments;

FIGS. 7B to 11B are cross-sectional views taken along a line II-II' of FIG. 2, according to some exemplary embodiments;

DETAILED DESCRIPTION OF THE EMBODIMENTS

Figure 1:
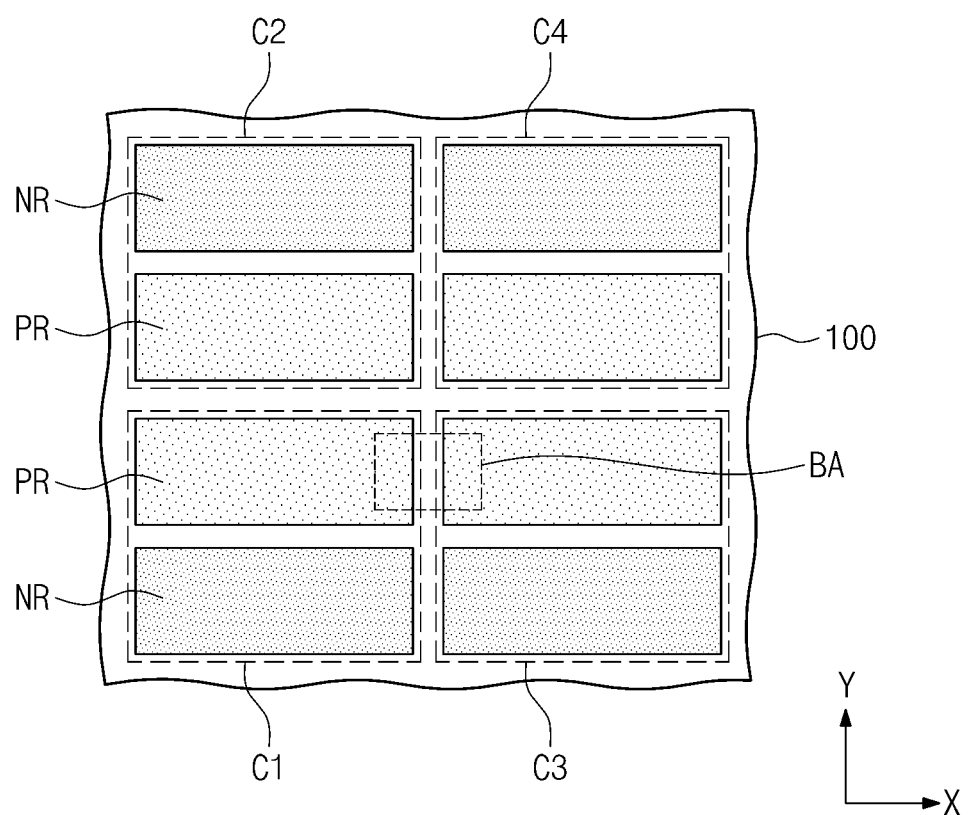
FIG. 1 is a plan view illustrating an exemplary semiconductor device according to some embodiments.

The disclosure will now be described more fully hereinafter with reference to the accompanying drawings, in which exemplary embodiments are shown. The advantages and features of the disclosure and methods of achieving them will be apparent from the following exemplary embodiments that will be described in more detail with reference to the accompanying drawings. It should be noted, however, that the inventive concepts are not limited to the following exemplary embodiments, and may be implemented in various forms. In the drawings, embodiments are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Further, the term "contact" refers to direct contact, unless indicated otherwise.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views. Accordingly, shapes of the exemplary views may be modified according to manufacturing techniques and/or allowable errors. Therefore, the disclosed embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. Unless the context indicates otherwise, these terms are only used to distinguish one element from another element. Thus, a first element in some embodiments could be termed a second element in other embodiments without departing from the teachings of the present invention. Exemplary embodiments explained and illustrated herein may include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning FIG. 1 is a plan view illustrating an exemplary semiconductor device according to some embodiments.

Referring to FIG. 1, a semiconductor device according to some embodiments will be described hereinafter. The semiconductor device may include a plurality of logic cells C1, C2, C3 and C4 provided on a substrate 100. In some embodiments, the semiconductor device includes a first logic cell C1, a third logic cell C3 spaced apart from the first logic cell C1 in a first direction (hereinafter, referred to as 'an x-direction'), a second logic cell C2 spaced apart from the first logic cell C1 in a second direction (hereinafter, referred to as 'a y-direction') intersecting the x-direction, and a fourth logic cell C4 spaced apart from the second logic cell C2 in the x-direction. Each of the logic cells C1, C2, C3 and C4 may include a P-type metal-oxide-semiconductor field effect transistor (PMOSFET) region PR and an N-type metal-oxide-semiconductor field effect transistor (NMOSFET) region NR. In some embodiments, the PMOSFET region PR and the NMOSFET region NR are spaced apart from each other in the y-direction. As such, the PMOSFET region PR and the NMOSFET region NR for a particular logic cell may be aligned in the y-direction, and two logic cells may be aligned in the x-direction. The PMOSFET region PR of the first logic cell C1 may be adjacent to the PMOSFET region PR of the second logic cell C2. Hereinafter, a logic cell is defined as a unit for performing one logic operation in the specification. For example, a logic cell may comprise an inverter, a NAND gate, etc., and may be used to implement functions of two or more transistors to perform a logic operation. As discussed above, a logic cell may comprise a complimentary metal-oxide-semiconductor (CMOS) circuit.

Figure 2:
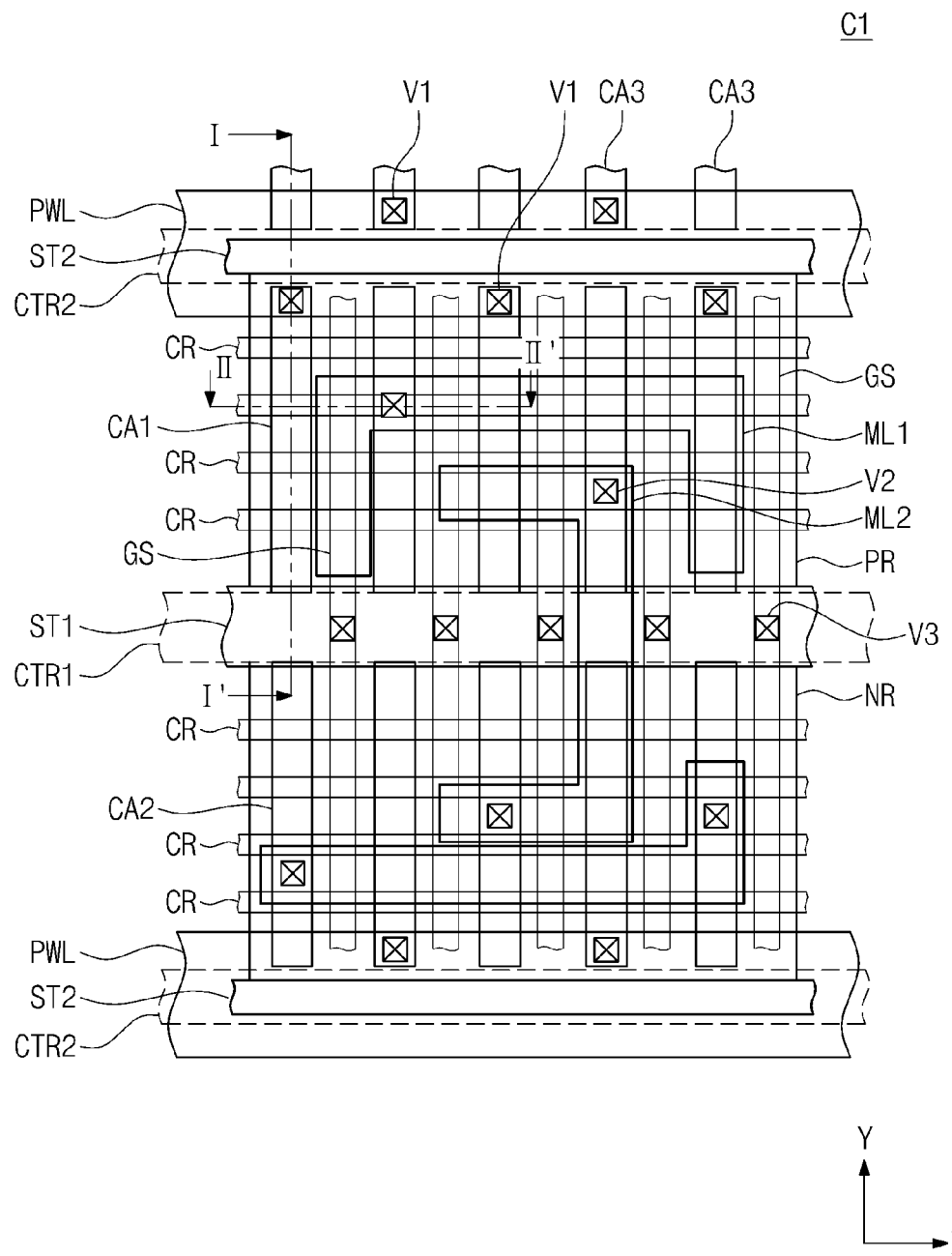
FIG. 2 is a plan view illustrating a first logic cell of FIG. 1, according to one exemplary embodiment.
Figure 3:
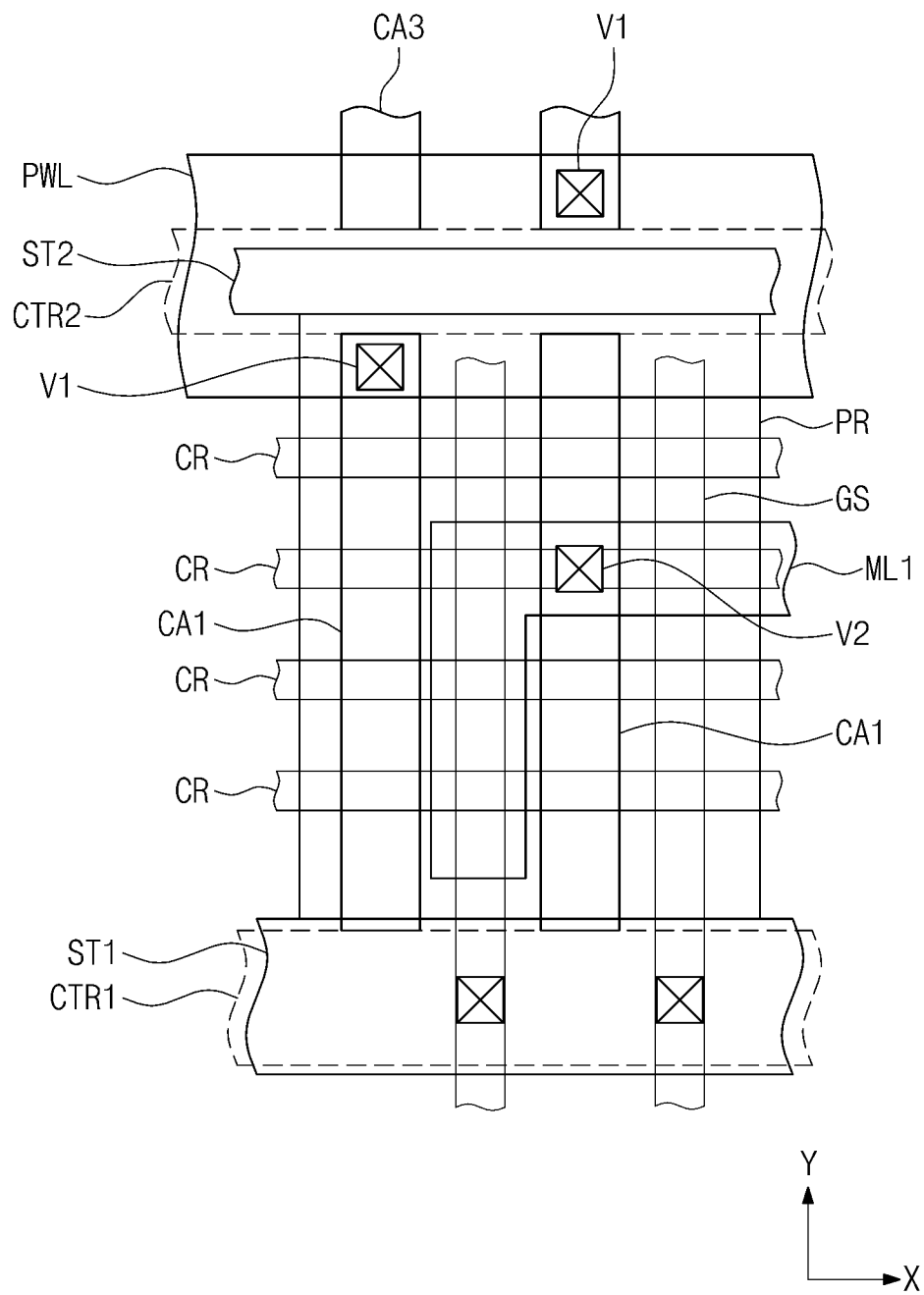
FIG. 3 is an enlarged view of a P-type metal-oxide-semiconductor field effect transistor (PMOSFET) region PR of FIG. 2, according to one exemplary embodiment.
Figure 4A:
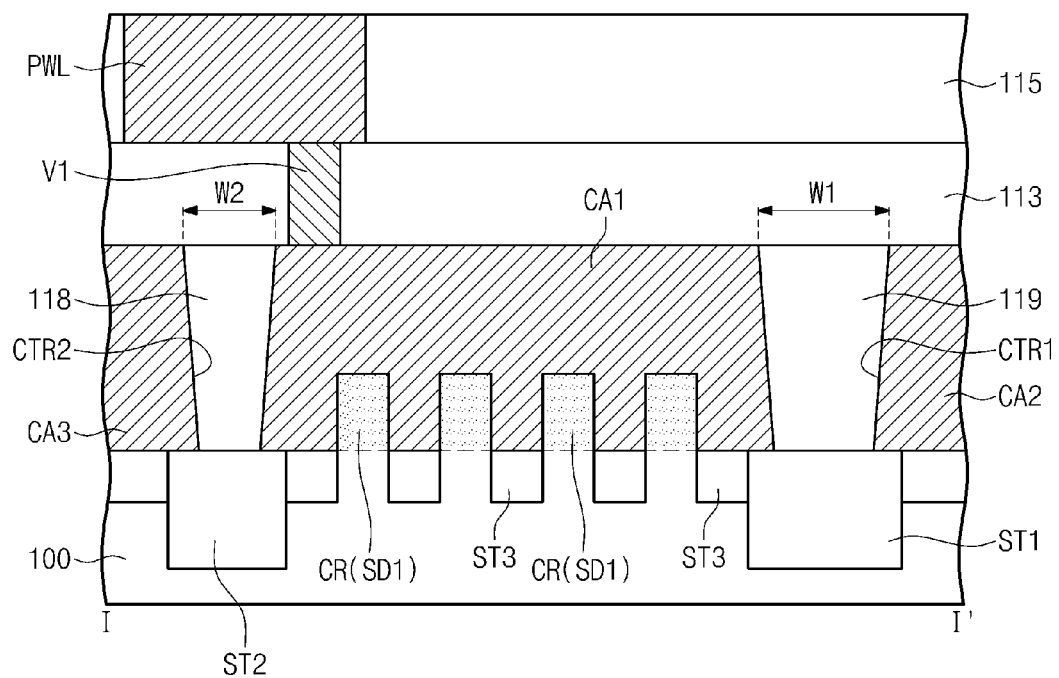
FIGS. 4A and 4B are cross-sectional views taken along lines I-I' and II-II' of FIG. 2, respectively, according to one exemplary embodiment.
Figure 4B:
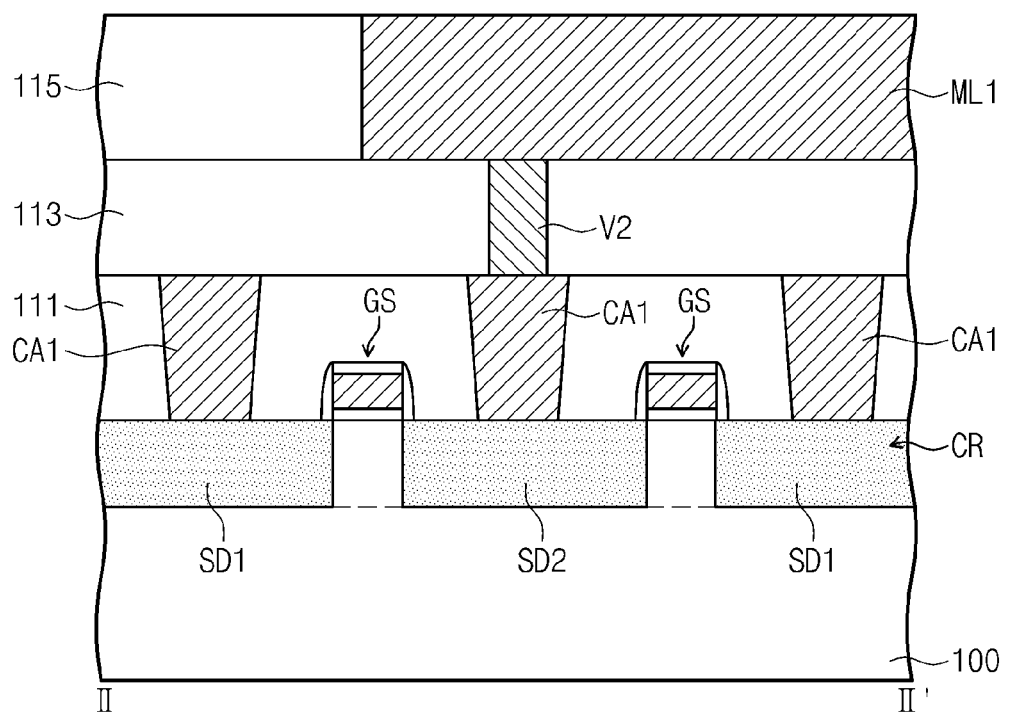

FIG. 2 is a plan view illustrating the first logic cell C1 of FIG. 1, according to one exemplary embodiment. FIG. 3 is an enlarged view of the PMOSFET region PR of FIG. 2, according to one exemplary embodiment. FIGS. 4A and 4B are cross-sectional views taken along lines I-I' and II-II' of FIG. 2, respectively, according to one exemplary embodiment. Hereinafter, the first logic cell C1 of FIG. 1 will be described as an example. However, the following descriptions to the first logic cell C1 may also be applied to other logic cells C2, C3 and C4.

Referring to FIGS. 1 to 3, 4A and 4B, the first logic cell C1 includes a first device isolation layer ST1 between the PMOSFET region PR and the NMOS region NR. The first device isolation layer ST1 is formed in an upper portion of the substrate 100. The substrate 100 may be, for example, a silicon substrate, a germanium substrate, or a silicon-on-insulator (SOI) substrate. Active regions of the PMOSFET region PR and the NMOSFET region NR are separated from each other by the first device isolation layer ST1. The active region of the first logic cell C1 is separated from an active region of another logic cell spaced apart from the first logic cell C1 in the y-direction by a second device isolation layer ST2. In one embodiment, a width of the first device isolation layer ST1 is greater than a width of the second device isolation layer ST2. As an example, the first and second device isolation layers ST1 and ST2 may include a silicon oxide layer.

The first logic cell C1 includes a plurality of active portions CR provided on the substrate 100. The active portions CR extend in the x-direction. In some embodiments, the active portions CR may have fin-shapes protruding from the substrate 100 between third device isolation layers ST3 extending in the x-direction. The third device isolation layers ST3 may have a width thinner than those of the first and second device isolation layers ST1 and ST2. Also, the third device isolation layers ST3 may have a depth shallower than those of the first and second device isolation layers ST1 and ST2. The active portions CR may be provided on the PMOSFET region PR and the NMOSFET region NR, respectively.

Gate structures GS are provided on the active portions CR. The gate structures GS cross over the active portions CR and extend in the y-direction. In one embodiment, the gate structures GS extend from the PMOSFET region PR through the first device isolation layer ST1 onto the NMOSFET region NR. Each of the gate structures GS may include a gate insulating layer and a gate electrode. The gate insulating layer may include, for example, a silicon oxide layer, a silicon oxynitride layer, and/or a high-k dielectric layer having a dielectric constant higher than that of a silicon oxide layer. The gate electrode may include, for example, at least one of a doped semiconductor, a metal, and a conductive metal nitride.

Source/drain regions SD1 and SD2 may be provided in the active portions CR. First source/drain regions SD1 and second source/drain regions may be alternately arranged in each active portion CR with the gate structures GS therebetween. The first source/drain regions SD1 and the second source/drain regions SD2 may be dopant regions having the same conductivity type. The first and second source/drain regions SD1 and SD2 of the PMOSFET region PR may be P-type dopant regions, and the first and second source/drain regions SD1 and SD2 of the NMOSFET region NR may be N-type dopant regions.

Contacts CA1 and CA2 extending in the y-direction are provided on the first and second source/drain regions SD1 and SD2. In some embodiments, the contacts CA1 and CA2 have bar-type shapes when viewed from a plan view. In some embodiments, lengths of the contacts CA1 and CA2 are substantially equal to each other. For example, the lengths of the contacts CA1 and CA2 may be in a range of about 150 nm to about 250 nm. A width of the contacts CA1 and CA2 may be in a range of about 15 nm to about 50 nm.

The contacts CA1 and CA2 in the first logic cell C1 include PMOS contacts CA1 on the PMOSFET region PR and NMOS contacts CA2 on the NMOSFET region NR. Each PMOS contact CA1 and each respective NMOS contact CA2 may be aligned with each other in the y-direction (e.g., formed along a single line). For example, a first trench CTRL may be provided to separate the PMOS contacts CA1 from the NMOS contacts CA2. A first separating insulation layer 119 may be provided in the first trench CTR1. The first separating insulation layer 119 may extend in the x-direction to separate the PMOS contacts CA1 from the NMOS contacts CA2 aligned with the PMOS contacts CA1. The first separating insulation layer 119 may have a straight line-shape. The contacts CA1 and CA2 may include at least one of a doped semiconductor, a conductive metal nitride, and a metal. For example, the contacts CA1 and CA2 may include at least one of copper (Cu), aluminum (Al), gold (Au), silver (Ag), tungsten (W), titanium (Ti), titanium nitride (TiN), and tungsten nitride (WN). The first separating insulation layer 119 may include at least one of silicon oxide, silicon nitride, and silicon oxynitride, for example.

The PMOS contacts CA1 may be in contact with the first and second source/drain regions SD1 and SD2 of the PMOSFET region PR. In some embodiments, the PMOS contacts CA1 contact top surfaces and sidewalls of the active portions CR of the PMOSFET region PR. The NMOS contacts CA2 may be in contact with the first and second source/drain regions SD1 and SD2 of the NMOSFET region NR. In some embodiments, the NMOS contacts CA2 contact top surfaces and sidewalls of the active portions CR of the NMOSFET region NR.

The contacts CA1 and CA2 of the first logic cell C1 may be separated from contacts of logic cells spaced apart from the first logic cell C1 in the y-direction by an insulating layer. In some embodiments, contacts CA3 in the second logic cell C2 spaced apart from the first logic cell C1 in the y-direction are respectively aligned with the PMOS contacts CA1 of the first logic cell C1 in the y-direction and may be separated from the PMOS contacts CA1 of the first logic cells C1 by a second trench CTR2. A second separating insulation layer 118 may be provided in the second trench CTR2. A width W2 of the second trench CTR2 may be smaller than a width W1 of the first trench CTR1. The second separating insulation layer 118 may have a straight line-shape. The second separating insulation layer 118 may include, for example, at least one of silicon oxide, silicon nitride, and silicon oxynitride.

First end portions of the PMOS contacts CA1, which are adjacent to the second logic cell C2, may be aligned with each other in the x-direction (e.g., may form a line extending in the x-direction). In other words, a sidewall of the second trench CTR2 may extend in the x-direction and the first end portions of the PMOS contacts CA1 may constitute the sidewall of the second trench CTR2. Second end portions of the PMOS contacts CA1, which are adjacent to the NMOSFET region NR, may be aligned with each other in the x-direction. In other words, a sidewall of the first trench CTR1 may extend in the x-direction and the second end portions of the PMOS contacts CA1 may constitute the sidewall of the first trench CTR1. Likewise, first end portions of the NMOS contacts CA2 may be aligned with each other in the x-direction and second end portions of the NMOS contacts CA2 may be aligned with each other in the x-direction.

A first interlayer insulating layer 111 may be provided to cover the gate structures GS. The contacts CA1, CA2 and CA3 may penetrate the first interlayer insulating layer 111. The first interlayer insulating layer 111 may include, for example, at least one of silicon oxide and silicon oxynitride.

First vias V1 and second vias V2 may be provided on the contacts CA1 and CA2. In the PMOSFET region PR, the first vias V1 may be connected to odd-numbered contacts of the PMOS contacts CA1 and the second vias V2 may be connected to even-numbered contacts of the PMOS contacts CA1. Similarly, in the NMOSFET region NR, the first vias V1 may be connected to even-numbered contacts of the NMOS contacts CA2 and the second vias V2 may be connected to odd-numbered contacts of the NMOS contacts CA2. In other embodiments, the first vias V1 may be connected to odd-numbered contacts of the NMOS contacts CA2 and the second vias V2 may be connected to even-numbered contacts of the NMOS contacts CA2 in the NMOSFET region NR. The first vias V1 and the second vias V2 may be provided in a second interlayer insulating layer 113 on the first interlayer insulating layer 111. The first and second vias V1 and V2 may be conductive vias, formed for example of a metal or other conductive material.

Common conductive lines PWL and first and second conductive lines ML1 and ML2 may be provided in a third interlayer insulating layer 115 on the second interlayer insulating layer 113. The common conductive lines PWL may extend in the x-direction on boundaries between the first logic cell C1 and neighboring logic cells spaced apart from the first logic cell C1 in the y-direction. In some embodiments, the common conductive lines PWL are provided between the PMOSFET region PR of the first logic cell C1 and a logic cell (i.e., the second logic cell C2) adjacent thereto in the y-direction and between the NMOSFET region NR of the first logic cell C1 and a logic cell adjacent thereto in the y-direction.

In some embodiments, a width of the common conductive line PWL may be greater than a width of the second separating insulation layer 118 under the common conductive line PWL. For example, the width of the common conductive line PWL may be in a range of about 100 nm to about 150 nm. The common conductive lines PWL and the first and second conductive lines ML1 and ML2 may include at least one of a doped semiconductor, a conductive metal nitride, and a metal. For example, the common conductive lines PWL and the first and second conductive lines ML1 and ML2 may include at least one of copper (Cu), aluminum (Al), gold (Au), silver (Ag), tungsten (W), titanium (Ti), titanium nitride (TiN) and tungsten nitride (WN).

In the PMOSFET region PR, the odd-numbered contacts of the PMOS contacts CA1 may be connected to the common conductive line PWL through the first vias V1. For example, the first vias V1 may be provided in overlapping regions of the common conductive lines PWL and the first end portions of the PMOS contacts CA1. In the PMOSFET region PR, the first source/drain regions SD1 may be provided with a drain voltage Vdd (e.g., a power voltage) from the common conductive line PWL through the odd-numbered PMOS contacts CA1 and the first vias V1.

In the PMOSFET region PR, the even-numbered contacts of the PMOS contacts CA1 may be connected to the first conductive line ML1 or the second conductive line ML2 through the second vias V2. The second vias V2 may not be provided on end portions of the PMOS contacts CA1, unlike the first vias V1, but may be disposed in consideration of positions and/or shapes of the first and second conductive lines ML1 and ML2. In the PMOSFET region PR, the second source/drain regions SD2 may be connected to the first and second conductive lines ML1 and ML2 through the even-numbered PMOS contacts CA1 and the second vias V2. In some embodiments, the first conductive line ML1 may be a conductive line electrically connecting the second vias V2 in the PMOSFET region PR to each other. The second conductive line ML2 may be a conductive line electrically connecting the second via V2 of the PMOSFET region PR to the second via V2 of the NMOSFET region NR.

In the NMOSFET region NR, the even-numbered contacts of the NMOS contacts CA2 may be connected to the common conductive line PWL through the first vias V1. For example, the first vias V1 may be provided in overlapping regions of the common conductive line PWL and the first end portions of the even-numbered NMOS contacts CA2. In the NMOSFET region NR, the second source/drain regions SD2 may be provided with a source voltage Vss (e.g., a ground voltage) from the common conductive line PWL through the even-numbered NMOS contacts CA2 and the first vias V1.

In the NMOSFET region NR, the odd-numbered contacts of the NMOS contacts CA2 may be connected to the first conductive line ML1 or the second conductive line ML2 through the second vias V2. In the NMOSFET region NR, the first source/drain regions SD1 may be connected to the first and second conductive lines ML1 and ML2 through the odd-numbered NMOS contacts CA2 and the second vias V2.

Third vias V3 may be provided on the gate structures GS. The third vias V3 may be portions of electrical paths for applying a gate voltage to the gate structures GS. The third vias V3 may be provided at the same level as the first and second vias V1 and V2. As illustrated in FIG. 2, the third vias V3 may be formed on the first device isolation layer ST1. However, the inventive concepts are not limited thereto.

According to some embodiments, the contacts CA1, CA2 and CA3 may be in direct contact with the first and second source/drain regions SD1 and SD2 without an additional silicide layer. Additionally, the contacts CA1, CA2 and CA3 may have bar-type shapes that have lengths substantially equal to each other to increase the degree of freedom of positions of the vias for applying voltages. If general plug-type contacts are used, positions of vias provided on the contacts may be limited by positions of the contacts. However, the bar-type contacts according to embodiments disclosed herein increase a choice range of positions of the vias formed thereon such that a more highly integrated interconnection structure may be formed without unnecessary routing.

Figure 5:
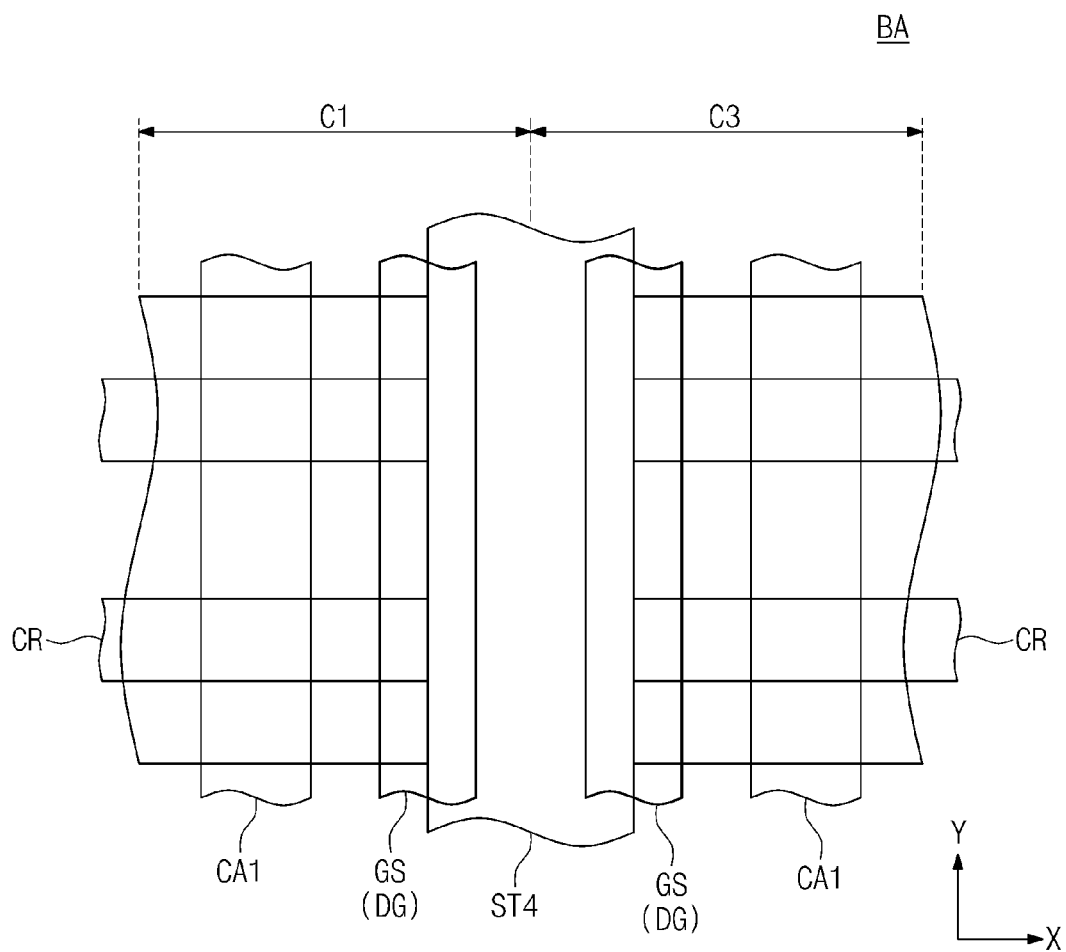
FIG. 5 is a plan view illustrating a boundary region BA between a first logic cell C1 and a third logic cell C3 of FIG. 1 according to some exemplary embodiments.

FIG. 5 is a plan view illustrating a boundary region BA between the first logic cell C1 and the third logic cell C3 of FIG. 1 according to some exemplary embodiments.

Referring to FIG. 5, a fourth device isolation layer ST4 may be provided between the first logic cell C1 and the third logic cell C3 that are spaced apart from each other in the x-direction. The fourth device isolation layer ST4 may be connected to the first and second device isolation layers ST1 and ST2. The nearest one of the gate structures GS of the first logic cell C1 to the fourth device isolation layer ST4 may be a dummy gate DG partially overlapping with the fourth device isolation layer ST4. Likewise, the nearest one of the gate structures GS of the third logic cell C3 to the fourth device isolation layer ST4 may be a dummy gate DG partially overlapping with the fourth device isolation layer ST4.

Figure 6:
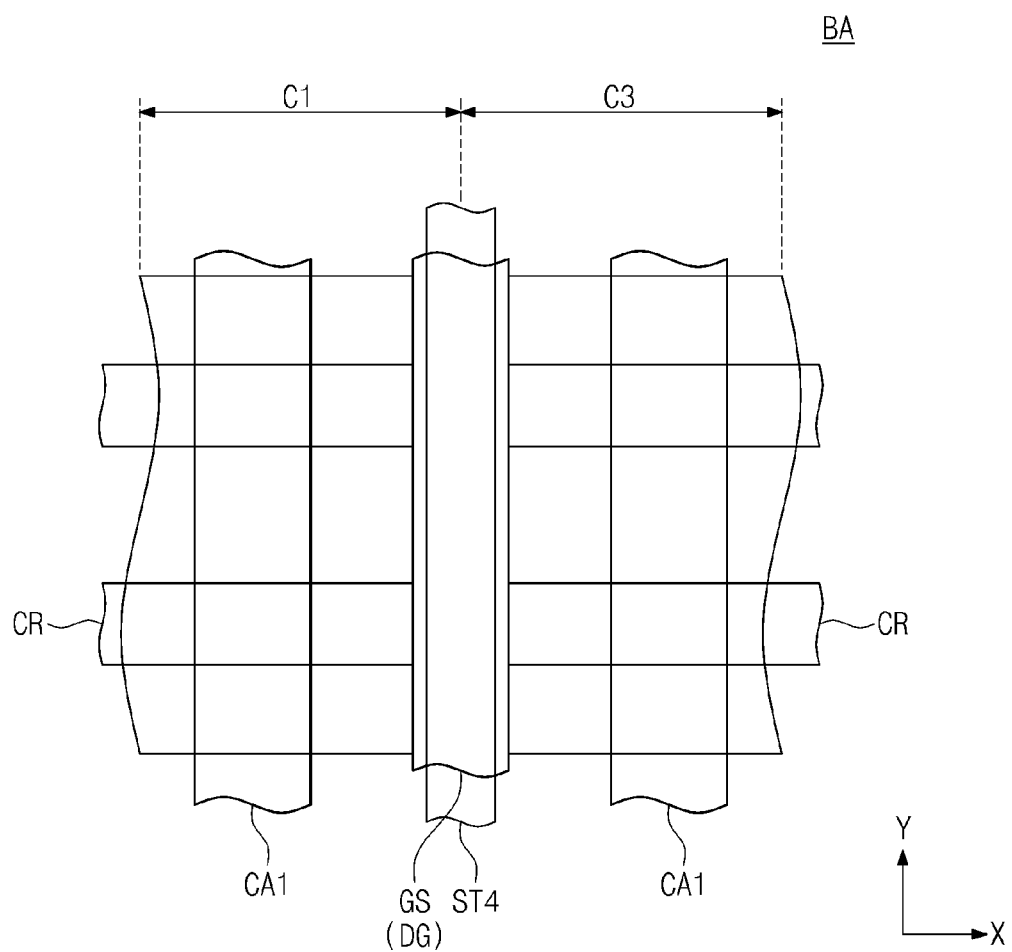
FIG. 6 is a plan view illustrating a boundary region BA between a first logic cell C1 and a third logic cell C3 of FIG. 1 according to other exemplary embodiments.
Figure 7A:
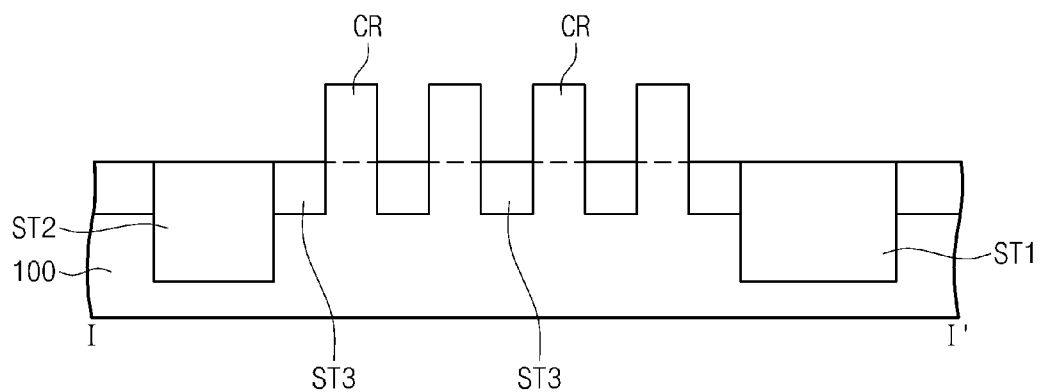
Figure 7B:
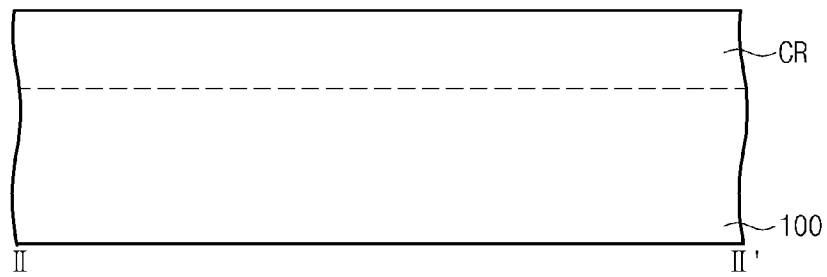
Figure 8A:
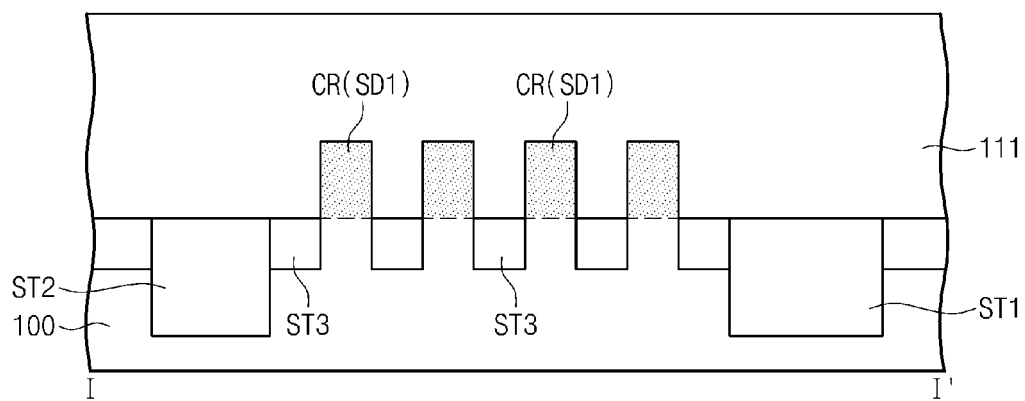
Figure 8B:
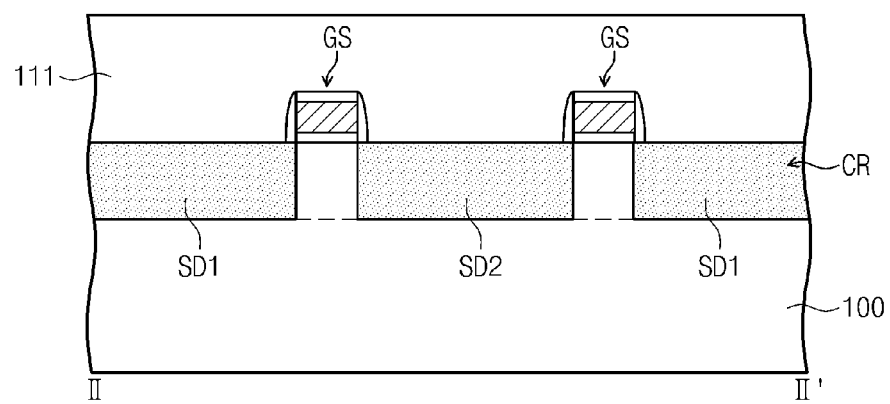
Figure 9A:
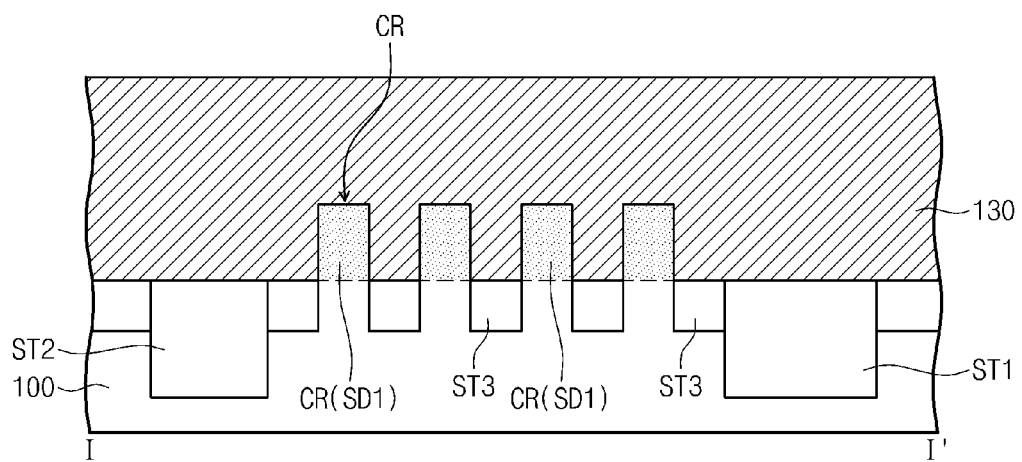
Figure 9B:
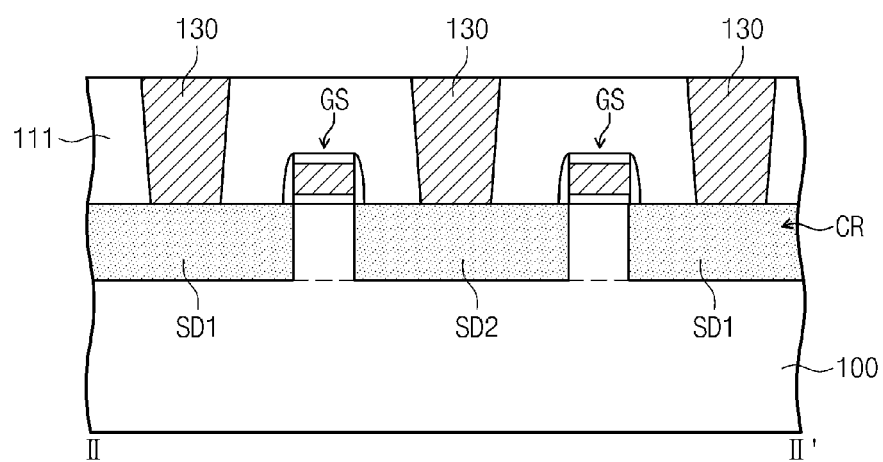
Figure 10A:
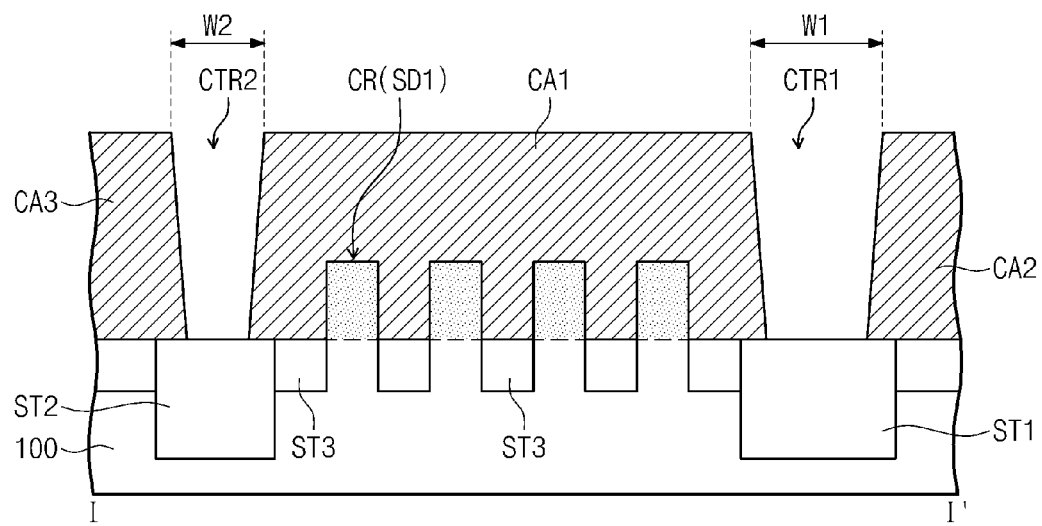
Figure 10B:
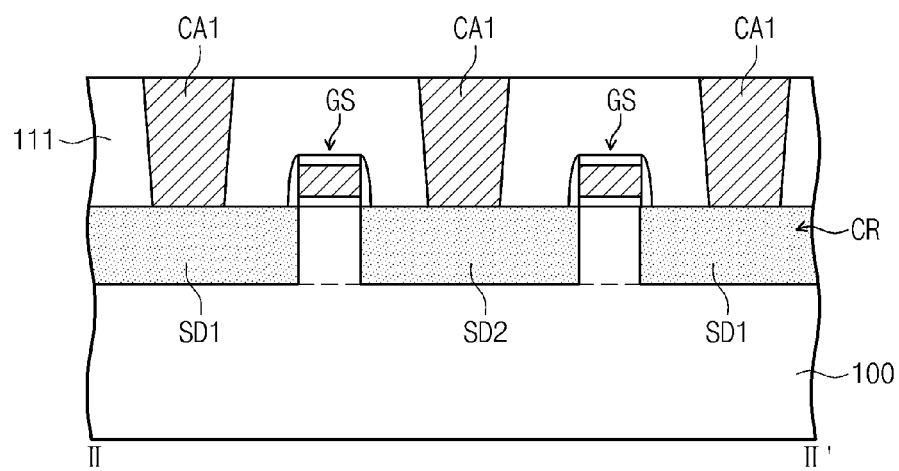
Figure 11A:
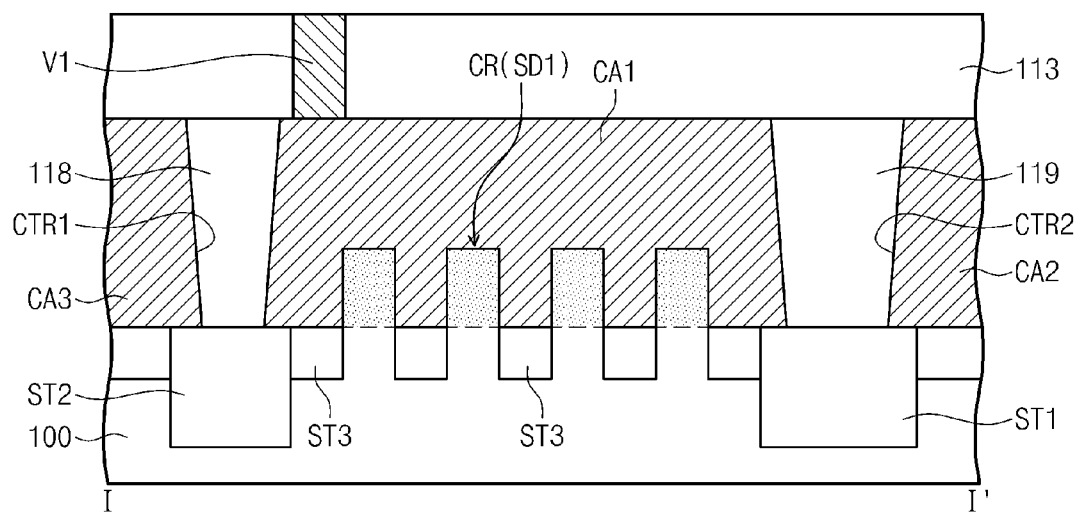
Figure 11B:
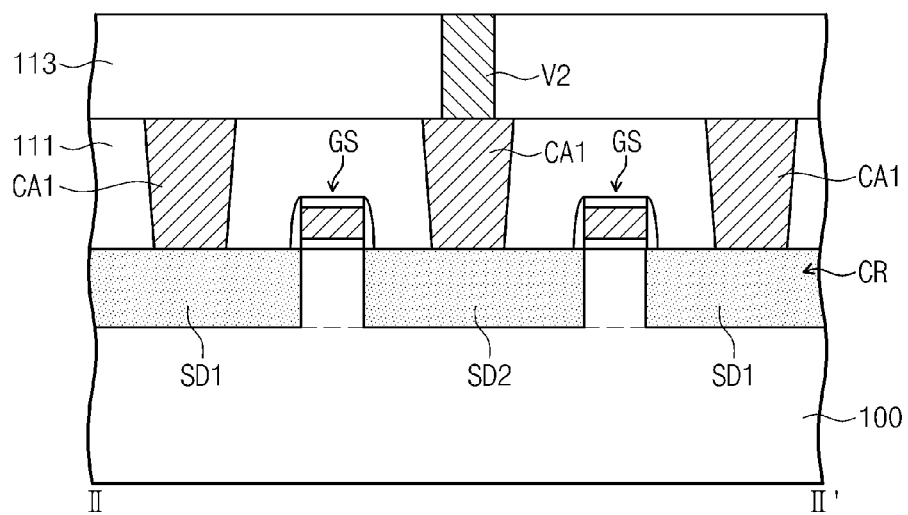

FIG. 6 is a plan view illustrating a boundary region BA between the first logic cell C1 and the third logic cell C3 of FIG. 1 according to other exemplary embodiments.

Referring to FIG. 6, one dummy gate DG may be provided between the first logic cell C1 and the third logic cell C3 that are spaced apart from each other in the x-direction. The dummy gate DG may cover a fourth device isolation layer ST4 and may extend along an extending direction of the fourth device isolation layer ST4.

FIGS. 7A to 11A are cross-sectional view taken along a line I-I' of FIG. 2 to illustrate an exemplary method of forming a semiconductor device according to some embodiments. FIGS. 7B to 11B are cross-sectional view taken along a line II-IF of FIG. 2.

Referring to FIGS. 1, 2, 7A and 7B, active portions CR are formed on a substrate 100. In some embodiments, the substrate 100 may be a silicon substrate, a germanium substrate, or a SOI substrate. In some embodiments, the active portions CR may have fin-shapes protruding from the substrate 100 between third device isolation layers ST3 extending in an x-direction. In some embodiments, an insulating pattern may be formed in an upper portion of the substrate 100 and then an upper portion of the insulating pattern is etched to form the active portions CR.

A first device isolation layer ST1 and a second device isolation layer ST2 are formed in the substrate 100. The first device isolation layer ST1 extends in the x-direction and separates a PMOSFET region PR and a NMOSFET region NR of a first logic cell C1 from each other. The second device isolation layer ST2 extends in the x-direction and separates the first logic cell C1 from a second logic cell C2 adjacent to the first logic cell C1. A width of the first device isolation layer ST1 may be greater than a width of the second device isolation layer ST2. The first and second device isolation layers ST1 and ST2 may be formed, for example, by a shallow trench isolation (STI) process. In one example, the first and second device isolation layers ST1 and ST2 include a silicon oxide layer. The first and second device isolation layers ST1 and ST2 may be formed to have a greater width and/or depth than the third isolation layers ST3.

Referring to FIGS. 1, 2, 8A and 8B, gate structures GS are formed to cross the active portions CR. The gate structures GS may extend in a y-direction. Each of the gate structures GS may include, for example, a gate insulating layer and a gate electrode that are sequentially stacked on the active portions CR. An insulating layer and a conductive layer may be sequentially formed on the active portions CR and then a patterning process may be performed on the conductive layer to from the gate structures GS. The insulating layer may include, for example, a silicon oxide layer, a silicon oxynitride layer, and/or a high-k dielectric layer having a dielectric constant higher than that of a silicon oxide layer. The conductive layer may include, for example, at least one of a doped semiconductor, a metal, and a conductive metal nitride. Each of the insulating layer and the conductive layer may be formed, for example, by a chemical vapor deposition (CVD) process and/or a sputtering process.

An ion implantation process may be performed on the resultant structure having the gate structures GS to form first source/drain regions SD1 and second source/drain regions SD2. In one embodiment, the first and second source/drain regions SD1 and SD2 are formed in portions of the active portions CR, which are not covered by the gate structures GS. The first source/drain regions SD1 and the second source/drain regions SD2 may be dopant regions having the same conductivity type.

In one embodiment, the first and second source/drain regions SD1 and SD2 of the PMOSFET region PR are formed by implanting p-type dopants, and the first and second source/drain regions SD1 and SD2 of the NMOSFET region NR are formed by implanting n-type dopants.

Referring to FIGS. 1, 2, 9A and 9B, a first interlayer insulating layer 111 is formed to cover the gate structures GS and then line-type conductive patterns 130 are formed to penetrate the first interlayer insulating layer 111. In one embodiment, the line-type conductive patterns 130 are connected to the first and second source/drain regions SD1 and SD2. The first interlayer insulating layer 111 may include, for example, a silicon oxide layer. Each of the line-type conductive patterns 130 extend in the y-direction to cross over a plurality of logic cells. The line-type conductive patterns 130 may be formed using a damascene process. In some embodiments, the first interlayer insulating layer 111 is etched to form trenches and then the trenches are filled with a conductive material to form the line-type conductive patterns 130. For example, the line-type conductive patterns 130 may include at least one of a doped semiconductor, a conductive metal nitride, and a metal. For example, the line-type conductive patterns 130 may include at least one of copper (Cu), aluminum (Al), gold (Au), silver (Ag), tungsten (W), titanium (Ti), titanium nitride (TiN), and tungsten nitride (WN). The line-type conductive patterns 130 may be formed, for example, using a CVD process or a sputtering process.

Referring to FIGS. 1, 2, 10A and 10B, the line-type conductive patterns 130 are patterned to form contacts CA1, CA2 and CA3. The contacts CA1, CA2 and CA3 may have bar-shapes. A first trench CTRL and a second trench CTR2 may be formed to penetrate the line-type conductive patterns 130. The first and second trenches CTR1 and CTR2 may extend in the x-direction. The first trench CTR1 may be formed in a boundary region of the PMOSFET region PR and the NMOSFET region NR, and the second trench CTR2 may be formed in a boundary region of logic cells adjacent to each other. In one embodiment, the first and second trenches CTR1 and CTR2 are formed at the same time. A width W1 of the first trench CTR1 may be greater than a width W2 of the second trench CTR2. However, the inventive concepts are not limited thereto. The formation process of the contacts CA1, CA2 and CA3 may include a process of forming a mask pattern and a dry and/or wet etching process using the mask pattern. Each of the contacts CA1, CA2 and CA3 may electrically connect a plurality of first source/drain regions SD1 (or a plurality of second source/drain regions SD1) thereunder to each other. Hereinafter, the contacts on the PMOSFET region PR may be called 'PMOS contacts CA1' and the contacts on the NMOSFET region NR may be called 'NMOS contacts CA2' in the first logic cell C1. The contacts may include the contacts CA3 included in the second logic cell C2 spaced apart from the first logic cell C1 in the y-direction. The contacts CA1, CA2 and CA3 are only classified depending on their positions. The contacts CA1, CA2 and CA3 may have a substantially same shape. For example, in one embodiment, each of the contacts CA1, CA2 and CA3 has a bar shape, and because the contacts, such as a contact CA1 and its corresponding respective contacts CA2 and CA3, are initially formed in a line pattern and are then separated by the trenches, a set of contacts that spans across at least three different regions (e.g., an NMOSFET region NR and PMOSFET region PR of a first logic cell, and at least another region (PR or NR of another logic cell) may be aligned along a single line and may have the same widths and/or lengths as each other.

Referring to FIGS. 1, 2, 11A and 11B, a second interlayer insulating layer 113 are formed to cover the contacts CA1, CA2 and CA3 and then vias V1 and V2 are formed to penetrate the second interlayer insulating layer 113. In the PMOSFET region PR, the first vias V1 may be connected to odd-numbered contacts of the PMOS contacts CA1 and the second vias V2 may be connected to even-numbered contacts of the PMOS contacts CA1. Similarly, in the NMOSFET region NR, the first vias V1 may be connected to even-numbered contacts of the NMOS contacts CA2 and the second vias V2 may be connected to odd-numbered contacts of the NMOS contacts CA2. In other embodiments, the first vias V1 may be connected to odd-numbered contacts of the NMOS contacts CA2 and the second vias V2 may be connected to even-numbered contacts of the NMOS contacts CA2 in the NMOSFET region NR. The first and second vias V1 and V2 may include, for example, at least one of a doped semiconductor, a conductive metal nitride, and a metal. For example, the first and second vias V1 and V2 may include at least one of copper (Cu), aluminum (Al), gold (Au), silver (Ag), tungsten (W), titanium (Ti), titanium nitride (TiN) and tungsten nitride (WN).

Referring to again FIGS. 1, 2, 4A and 4B, a third interlayer insulating layer 115 may be formed on the second interlayer insulating layer 113 and then common conductive lines PWL and first and second conductive lines ML1 and ML2 may be formed in the third interlayer insulating layer 115. The common conductive lines PWL may extend in the x-direction between the first logic cell C1 and neighboring logic cells spaced apart from the first logic cell C1 in the y-direction. In some embodiments, the common conductive lines PWL may be provided between the PMOSFET region PR of the first logic cell C1 and a logic cell (i.e., the second logic cell C2) adjacent thereto in the y-direction and between the NMOSFET region NR of the first logic cell C1 and a logic cell adjacent thereto in the y-direction. In some embodiments, a width of the common conductive line PWL may be greater than a width of the second separating insulation layer 118 under the common conductive line PWL. The common conductive lines PWL and the first and second conductive lines ML1 and ML2 may include at least one of a doped semiconductor, a conductive metal nitride, and a metal. For example, the common conductive lines PWL and the first and second conductive lines ML1 and ML2 may include at least one of copper (Cu), aluminum (Al), gold (Au), silver (Ag), tungsten (W), titanium (Ti), titanium nitride (TiN) and tungsten nitride (WN). The common conductive lines PWL and the first and second conductive lines ML1 and ML2 may be formed using a CVD process or a sputtering process.

In the PMOSFET region PR, the odd-numbered contacts of the PMOS contacts CA1 may be connected to the common conductive line PWL through the first vias V1. In other words, the first vias V1 may be provided in overlapping regions of the common conductive lines PWL and first end portions of the PMOS contacts CA1. The contacts CA3 of the second logic cell may be connected to the common conductive line PWL through first vias V1 included in the second logic cell.

In the PMOSFET region PR, the even-numbered contacts of the PMOS contacts CA1 may be connected to the first conductive line ML1 or the second conductive line ML2 through the second vias V2. In some embodiments, the first conductive line ML1 may be a conductive line electrically connecting the second vias V2 in the PMOSFET region PR to each other, and the second conductive line ML2 may be a conductive line electrically connecting the second via V2 disposed in the PMOSFET region PR to the second via V2 disposed in the NMOSFET region NR.

In the NMOSFET region NR, the even-numbered contacts of the NMOS contacts CA2 may be connected to the common conductive line PWL through the first vias V1. In other words, the first vias V1 may be provided in overlapping regions of the common conductive line PWL and first end portions of the even-numbered NMOS contacts CA2. In the NMOSFET region NR, the odd-numbered contacts of the NMOS contacts CA2 may be connected to the first conductive line ML1 or the second conductive line ML2 through the second vias V2.

According to some embodiments, the contacts CA1, CA2 and CA3 are formed by patterning the line-type conductive patterns 130. For example, the line-type conductive patterns 130 may be divided into individual contacts by the first and second trenches CTRL and CTR2 penetrating the line-type conductive patterns 130. Since the contacts CA1, CA2 and CA3 are formed by patterning the line-type conductive patterns 130, it is possible to overcome limitations of a photolithography process caused when contacts are individually formed. As a result, a distance between the contacts of adjacent logic cells may be reduced as compared with a general technique such that an integration degree of the semiconductor device may be improved. For example, it is possible to reduce a distance between the PMOS contact CA1 of the first logic cell C1 and the PMOS contact C3 of the second logic cell C2 spaced apart from the first logic cell C1 in the y-direction, i.e., a tip-to-tip distance between the contacts CA1 and CA3. If contacts are individually formed, a distance between the individual contacts may be determined depending on a distance between contact holes used as a mold of a damascene process, and the distance between the contact holes may be equal to or greater than a certain distance determined by a limitation of a photolithography technique. As a result, an additional silicide layer may be required in order to strap a plurality of active portions CR. A plurality of patterning processes may need to be performed in order to form the silicide layer for strapping the plurality of active portions CR. Thus, processes may be complex and manufacture costs of semiconductor devices may increase.

The contacts CA1, CA2 and CA3, on the other hand, may have the bar-shapes and may be connected to the first source/drain regions SD1 or the second source/drain regions SD2 thereunder. Thus, the plurality of active portions CR may be strapped without an additional silicide layer between the contacts CA1, CA2 and CA3 and the first and second source/drain regions SD1 and SD2.

Additionally, if contacts are individually formed, end portions of contacts are defined by shapes of contact holes used as a mold of a damascene process. The shapes of the contact holes may have rounded end portions by characteristics of a patterning process such that an align margin of the contacts and vias formed on the contacts may be reduced. According to some embodiments, however, the contacts CA1, CA2 and CA3 are formed by patterning the line-type conductive patterns 130 such that the end portions of the contacts CA1, CA2 and CA3 are not rounded to secure or improve the align margin of the vias.

Figure 12:
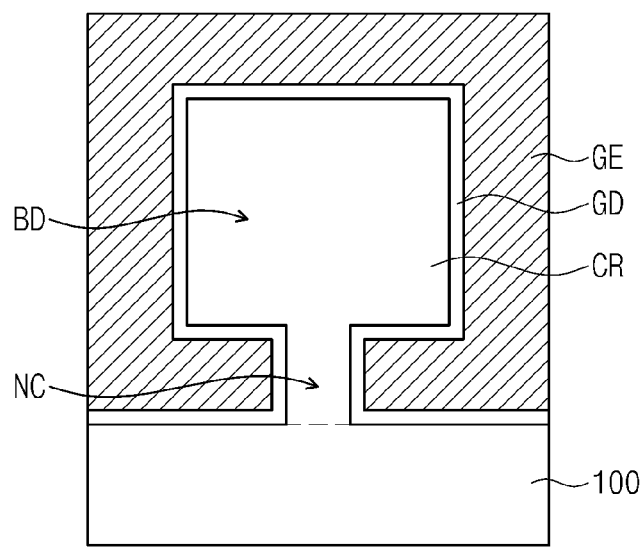
FIG. 12 is a conceptual diagram illustrating an active portion of a semiconductor device according to still other exemplary embodiments.

The active portions CR are described above as having fin-shapes. However, the inventive concepts are not limited thereto. Shapes of the active portions CR may be variously modified. FIG. 12 is a conceptual diagram illustrating an active portion of a semiconductor device according to still other embodiments. In the present embodiment, a cross section of the active portion CR may have an omega-shape including a neck portion NC adjacent to the substrate 100 and a body portion BD having a wider width than the neck portion NC. In one embodiment, the body portion is rectangular. However, the body portion is not limited as such. A gate insulating layer GD and a gate electrode GE may be sequentially provided on the active portion CR. A portion of the gate electrode GE may extend under the body portion BD.

Figure 13:
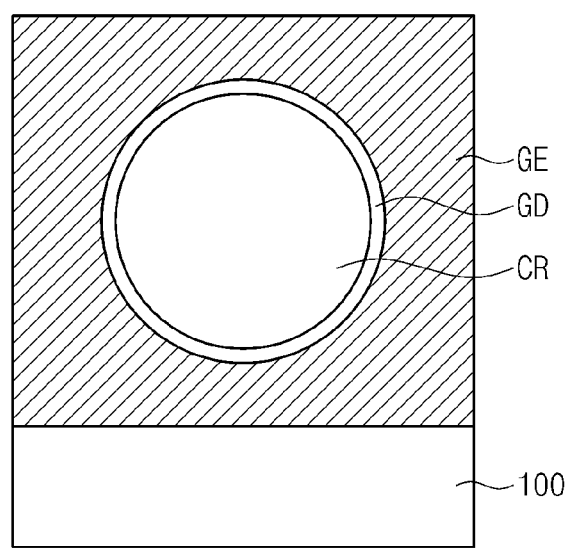
FIG. 13 is a conceptual diagram illustrating an active portion of a semiconductor device according to yet other exemplary embodiments.

FIG. 13 is a conceptual diagram illustrating an active portion of a semiconductor device according to yet other embodiments. In the present embodiment, an active portion CR of a semiconductor device may have a nanowire-shape spaced apart from the substrate 100. A gate electrode insulating layer GD and a gate electrode GE may be sequentially provided on the active portion CR. The gate electrode GE may extend between the active portion CR and the substrate 100.

Figure 14:
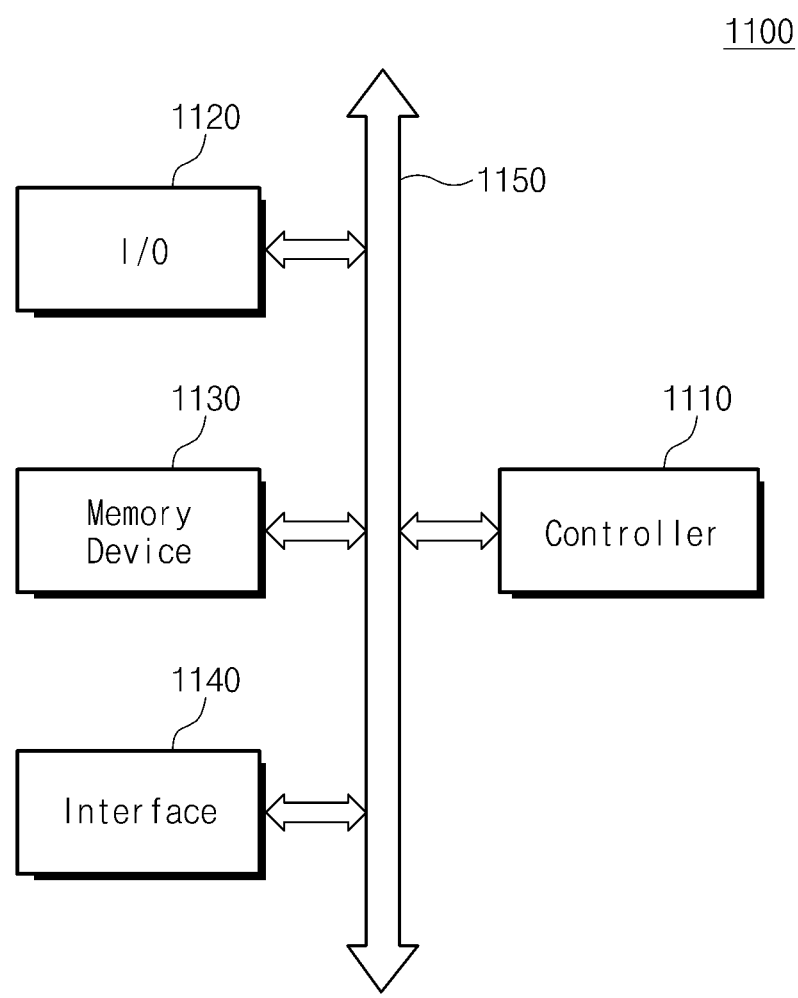
FIG. 14 is a schematic block diagram illustrating an example of electronic systems including semiconductor devices according to various exemplary embodiments.

FIG. 14 is a schematic block diagram illustrating an example of electronic systems including semiconductor devices according to certain exemplary embodiments.

Referring to FIG. 14, an electronic system 1100 according to one embodiment includes a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast dynamic random access memory (DRAM) device and/or a fast static random access memory (SRAM) device which acts as a cache memory for improving an operation of the controller 1110. A semiconductor device according to certain embodiments may be provided into the memory device 1130, the controller 1110, and/or the I/O unit 1120.

The electronic system 1100 may be applied to a personal digital assistant (PDA), a portable computer, a web tablet, a wireless phone, a mobile phone, a digital music player, a memory card, or other electronic products. These other electronic products may receive or transmit information data by wireless, or in a wired manner.

The semiconductor device according to certain disclosed embodiments includes the bar-type contacts connecting the plurality of active portions. The bar-type contacts may improve the degree of freedom of the vias provided thereon. Since the bar-type contacts are formed by patterning the line-type conductive patterns, a more highly integrated device may be formed.

While the disclosure has been described with reference to example embodiments, it will be apparent to those skilled in the art that various changes and modifications may be made without departing from the spirits and scopes of the disclosed embodiments. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a substrate on which a plurality of logic cells are provided;
a plurality of active portions provided on the substrate and extending in a first direction;
contacts and gate structures extending in a second direction intersecting the first direction, the contacts and the gate structures alternately arranged;
a common conductive line extending along a boundary region of the plurality of logic cells in the first direction,
wherein at least one of the contacts is electrically connected to the common conductive line through a via therebetween,
wherein each of the contacts intersects a plurality of the active portions,
wherein end portions of the contacts are aligned with each other along the first direction,
wherein each of the logic cells includes a P-type metal-oxide-semiconductor field effect transistor (PMOSFET) region and an N-type metal-oxide-semiconductor field effect transistor (NMOSFET) region,
wherein the contacts include PMOS contacts on the PMOSFET region and NMOS contacts on the NMOSFET region, and
wherein the PMOS contacts and the NMOS contacts are seperated from each other at a boundary region of the PMOSFET region and the NMOSFET region; and
a first device isolation layer provided in the substrate between the PMOSFET region and the NMOSFET region, and
wherein end portions of the PMOS contacts or the NMOS contacts are aligned with each other in the first direction on the first device isolation layer.

2. The semiconductor device of claim 1, wherein each of the contacts is in contact with the plurality of active portions.

3. The semiconductor device of claim 1, wherein each of the plurality of active portions includes source/drain regions, and wherein each of the contacts is connected in common to a plurality of source/drain regions adjacent to each other in the second direction.

4. The semiconductor device of claim 1, wherein each PMOS contact is aligned with a respective NMOS contact in the second direction.

5. The semiconductor device of claim 1, further comprising:
a first separating insulation layer extending in the first direction on the boundary region of the PMOSFET region and the NMOSFET region,
wherein the first separating insulation layer separates the PMOS contacts from the NMOS contacts.

6. The semiconductor device of claim 1, wherein the plurality of logic cells comprises: a first logic cell; and a second logic cell spaced apart from the first logic cell, and the common conductive line is disposed between the first logic cell and the second logic cell,
the semiconductor device, further comprising:
a second device isolation layer provided in the substrate between the first logic cell and the second logic cell, wherein the second device isolation layer extends along the common conductive line in the first direction.

7. The semiconductor device of claim 6, wherein a plurality of contacts are included in the first logic cell and a plurality of contacts are included in the second logic cell, and further comprising:
a separating insulation layer separating the contacts of the first logic cell from the contacts of the second logic cell,
wherein the separating insulation extends in the first direction under the common conductive line, and
wherein the contacts of the first logic cell are aligned with the contacts of the second logic cell in the second direction.

8. The semiconductor device of claim 1, wherein the gate structures extend from the PMOSFET region into the NMOSFET region.

9. A semiconductor device, comprising:
a substrate on which a plurality of logic cells are provided;
a plurality of active portions provided on the substrate and extending in a first direction;
contacts and gate structures extending in a second direction intersecting the first direction, the contacts and the gate structures alternately arranged;
a common conductive line extending along a boundary region of the plurality of logic cells in the first direction,
wherein at least one of the contacts is electrically connected to the common conductive line through a via therebetween,
wherein each of the contacts intersects a plurality of the active portions,
wherein end portions of the contacts are aligned with each other along the first direction,
wherein odd-numbered contacts of the contacts are electrically connected to the common conductive line through vias therebetween, and
wherein even-numbered contacts of the contacts are spaced apart from the common conductive line by an interlayer insulating layer therebetween.

10. The semiconductor device of claim 1, wherein lengths of the contacts are substantially equal to each other.

11. A semiconductor device comprising:
a substrate on which a plurality of logic cells are provided, each logic cell including a P-type metal-oxide-semiconductor field effect transistor (PMOSFET) region and an N-type metal-oxide-semiconductor field effect transistor (NMOSFET) region;
a plurality of active portions provided on the substrate and extending in a first direction;
contacts and gate structures extending in a second direction intersecting the first direction, the contacts and the gate structures alternately arranged; and
a common conductive line extending along a boundary region of the plurality of logic cells in the first direction,
wherein at least one of the contacts is electrically connected to the common conductive line through a via therebetween,
wherein each of the contacts has a bar shape extending in the second direction and covers a plurality of the active portions, and
wherein end portions of the contacts are aligned with each other along the first direction.

12. The semiconductor device of claim 11, wherein:
a first set of the contacts electrically connects to the common conductive line through a first set of vias; and
a second set of the contacts electrically connects to a conductive line different from the common conductive line through a second set of vias.

* * * * *